United States Patent
Zou et al.

(10) Patent No.: US 11,202,156 B2
(45) Date of Patent: *Dec. 14, 2021

(54) MEMS CAPACITOR MICROPHONE

(71) Applicant: Goertek, Inc., Weifang (CN)

(72) Inventors: Quanbo Zou, Weifang (CN); Yongwei Dong, Weifang (CN)

(73) Assignee: Goertek, Inc., Shandong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/760,540

(22) PCT Filed: Sep. 6, 2018

(86) PCT No.: PCT/CN2018/104440
§ 371 (c)(1),
(2) Date: Apr. 30, 2020

(87) PCT Pub. No.: WO2020/000649
PCT Pub. Date: Jan. 2, 2020

(65) Prior Publication Data
US 2021/0227335 A1    Jul. 22, 2021

(30) Foreign Application Priority Data

Jun. 25, 2018    (CN) .......................... 201810660834.3

(51) Int. Cl.
*H04R 19/04*    (2006.01)
*H04R 1/06*    (2006.01)
(Continued)

(52) U.S. Cl.
CPC ........... *H04R 19/04* (2013.01); *B81B 3/0021* (2013.01); *H04R 1/06* (2013.01); *H04R 3/00* (2013.01);
(Continued)

(58) Field of Classification Search
CPC . H04R 19/04; H04R 1/06; H04R 3/00; H04R 7/06; H04R 7/18; H04R 2201/003;
(Continued)

(56) References Cited

U.S. PATENT DOCUMENTS 5,929,497 A * 7/1999 Chavan .................. B81B 7/007
257/417
6,109,113 A * 8/2000 Chavan ................. G01L 9/0073
73/706
(Continued)

FOREIGN PATENT DOCUMENTS

CN        106303867 A    1/2017
JP        2010045430 A    2/2010
WO     WO2007117198 A1   10/2007

*Primary Examiner* — David L Ton
(74) *Attorney, Agent, or Firm* — Baker Botts, LLP

(57) ABSTRACT

An MEMS capacitor microphone is provided, comprising a first substrate and a vibration diaphragm supported above the first substrate by a spacing portion, the first substrate, the spacing portion, and the vibration diaphragm enclosing a vacuum chamber, and a static deflection distance of the vibration diaphragm under an atmospheric pressure being less than a distance between the vibration diaphragm and the first substrate, wherein a lower electrode forming a capacitor structure with the vibration diaphragm is provided on a side of the first substrate that is adjacent to the vacuum chamber, and an electric field between the vibration diaphragm and the lower electrode is 100-300 V/μm.

10 Claims, 3 Drawing Sheets

(51) Int. Cl.
   *H04R 3/00*    (2006.01)
   *H04R 7/06*    (2006.01)
   *H04R 7/18*    (2006.01)
   *B81B 3/00*    (2006.01)

(52) U.S. Cl.
   CPC ............... *H04R 7/06* (2013.01); *H04R 7/18* (2013.01); *B81B 2201/0257* (2013.01); *B81B 2203/0127* (2013.01); *B81B 2203/04* (2013.01); *B81B 2207/015* (2013.01); *H04R 2201/003* (2013.01)

(58) Field of Classification Search
   CPC .......... B81B 3/0021; B81B 2201/0257; B81B 2203/0127; B81B 2203/04; B81B 2207/015
   See application file for complete search history.

(56) References Cited

U.S. PATENT DOCUMENTS

| | | |
|---|---|---|
| 10,349,185 B2 | 7/2019 | Hu |
| 2003/0046554 A1 | 3/2003 | Leydier et al. |
| 2013/0047746 A1* | 2/2013 | Nakamura ............ G01L 9/0019 73/862.59 |
| 2015/0001647 A1* | 1/2015 | Dehe ..................... B81B 3/0021 257/416 |
| 2018/0022600 A1* | 1/2018 | Alsaiary ............... G01L 9/0042 438/50 |
| 2018/0352341 A1* | 12/2018 | Reinmuth ................ H04R 7/04 |
| 2020/0260192 A1* | 8/2020 | Zou ......................... B81B 7/008 |
| 2020/0267480 A1* | 8/2020 | Zou ........................ H04R 19/04 |
| 2020/0359127 A1* | 11/2020 | Zou ........................ H04R 1/283 |

\* cited by examiner ously limit the performance of the MEMS microphone.

MEMS CAPACITOR MICROPHONE

CROSS-REFERENCE TO RELATED APPLICATIONS

This application is a National Stage of International Application No. PCT/CN2018/104440, filed on Sep. 6, 2018, which claims priority to Chinese Patent Application No. 201810660834.3, filed on Jun. 25, 2018, both of which are hereby incorporated by reference in their entireties.

TECHNICAL FIELD

The present disclosure relates to the field of acoustic-electric conversion, and more particularly to an MEMS (micro electro-mechanical systems) capacitor microphone, especially a capacitor microphone structure with a high SNR (signal-to-noise ratio).

BACKGROUND

Prevailing MEMS microphones, such as a capacitive sensing structure and a piezoelectric sensing structure, are designed with a big back cavity with an ambient pressure, so as to ensure that the rigidity of flowing air is much smaller than that of the vibration diaphragm. A volume of the back cavity is generally much larger than 1 mm$^3$, and for example is generally designed to be 1-15 mm$^3$. Moreover, a cavity of a microphone chip needs to be open when the microphone chip is packaged, which limits a design of the smallest package size of the MEMS microphone (>3 mm$^3$).

The reason is that if the volume of the back cavity is too small, a circulation of air is blocked, and the rigidity of the air will greatly reduce the mechanical sensitivity of the vibration diaphragm. In addition, for pressure equalization, dense perforation holes are usually designed in a backplate, and the air flow resistance in the gap or perforation holes caused by air viscosity becomes a dominant factor of noise of the MEMS microphone, thereby limiting the high signal-to-noise ratio performance of the microphone.

SUMMARY

An object of the present disclosure is to provide a novel technical solution of an MEMS capacitor microphone.

According to a first aspect of the present disclosure, there is provided an MEMS capacitor microphone, comprising a first substrate and a vibration diaphragm supported above the first substrate by a spacing portion, the first substrate, the spacing portion, and the vibration diaphragm enclosing a vacuum chamber, and a static deflection distance of the vibration diaphragm under an atmospheric pressure being less than a distance between the vibration diaphragm and the first substrate, wherein a lower electrode forming a capacitor structure with the vibration diaphragm is provided on a side of the first substrate that is adjacent to the vacuum chamber, and an electric field between the vibration diaphragm and the lower electrode is 100-300 V/μm.

Optionally, the vibration diaphragm comprises an insulating material, and an upper electrode forming a capacitor structure with the lower electrode is provided on the vibration diaphragm.

Optionally, the vibration diaphragm comprises a composite structure, the upper electrode being provided in the composite structure of the vibration diaphragm.

Optionally, the upper electrode on the vibration diaphragm is electrically connected to a circuit layout on the first substrate by a lead.

Optionally, the vibration diaphragm has a mechanical sensitivity of 0.02 to 0.9 nm/Pa.

Optionally, an initial gap between the vibration diaphragm and the first substrate is 1-100 μm.

Optionally, the MEMS capacitor microphone further comprises an ASIC circuit integrated on the first substrate.

Optionally, a reinforcing portion is provided at a central region of the vibration diaphragm that is away from the vacuum chamber.

Optionally, a second substrate is further provided on a side of the vibration diaphragm that is away from the vacuum chamber, and an opening exposing the vibration diaphragm is formed on the second substrate at a position corresponding to a central region of the vibration diaphragm.

Optionally, a bonding pad for an external connection is provided on a side of the first substrate that is away from the vacuum chamber.

According to the MEMS microphone of the present disclosure, the vacuum chamber is enclosed between the vibration diaphragm and the first substrate, such that a high electric field can be formed in the vacuum chamber without breakdown, thereby greatly improving the sensitivity of the MEMS microphone.

According to the MEMS microphone of the disclosure, the vacuum chamber is enclosed between the vibration diaphragm and the first substrate, and the air viscosity in the vacuum chamber is much lower than the air viscosity in the ambient pressure, thereby reducing the influence of acoustic resistance on the vibration of the vibration diaphragm, and improving the signal-to-noise ratio of the microphone. In addition, since the MEMS microphone of such structure does not require a relatively large volume of a back cavity, the overall size of the MEMS microphone can be greatly reduced, and the reliability of the microphone is enhanced.

Further features of the present disclosure and advantages thereof will become apparent from the following detailed description of exemplary embodiments according to the present disclosure with reference to the attached drawings.

BRIEF DESCRIPTION OF THE DRAWINGS

The accompanying drawings, which are incorporated in and constitute a part of the description, illustrate embodiments of the present disclosure and, together with the description thereof, serve to explain the principles of the present disclosure.

DETAILED DESCRIPTION

Technical problems to be solved, technical solutions to be adopted, and technical effects to be obtained by the present disclosure are to be easily understood from the further detailed description of particular embodiments according to the present disclosure in conjunction with the attached drawings.

Figure 1:
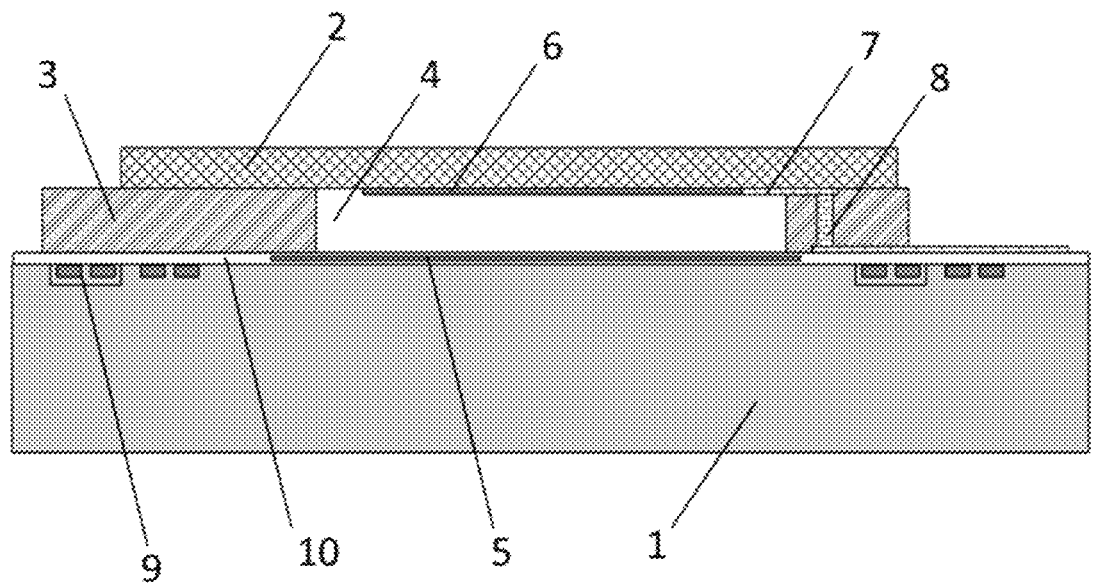
FIG. 1 is a schematic structural view of a first embodiment of a microphone of the present disclosure.

Referring to FIG. 1, the present disclosure provides an MEMS microphone comprising a first substrate 1 and a vibration diaphragm 2 supported above the first substrate 1 by a spacing portion 3. The first substrate 1, the spacing portion 3, and the vibration diaphragm 2 enclose a vacuum chamber 4.

The first substrate 1 according to the present disclosure may be made of monocrystalline silicon or other materials well known to those skilled in the art, and the spacing portion 3 and the vibration diaphragm 2 supported on the first substrate 1 by the spacing portion 3 may be formed by depositing layer by layer, patterning and sacrificial processes. If necessary, an insulating layer 10 is further provided between the spacing portion 3 and the first substrate 1, which will not be specifically explained herein.

The vacuum chamber 4 may be sealed, for example, by low pressure plasma enhanced chemical vapor deposition (PECVD) at 200-350° C. Such MEMS process belongs to common general knowledge of those skilled in the art and will not be specifically explained herein. The vacuum chamber 4 is preferably less than 1 kPa, so that the residual air viscosity in the vacuum chamber 4 is much lower than the air viscosity at standard pressure.

Since the vacuum chamber having an air pressure lower than the atmospheric pressure is formed between the vibration diaphragm 2 and the first substrate 1, the vibration diaphragm 2 is statically deflected under the atmospheric pressure and without a sound pressure, that is, the vibration diaphragm 2 is statically deflected towards the first substrate 1. In order to prevent the vibration diaphragm 2 from being deflected to get into contact with the first substrate 1 when the vibration diaphragm 2 is static, a static deflection distance of the vibration diaphragm 2 is designed to be less than a distance between the vibration diaphragm 2 and the first substrate 1, which can be implemented mainly by changing the rigidity of the vibration diaphragm 2 and/or the distance between the vibration diaphragm 2 and the first substrate 1.

For example, the thickness of the vibration diaphragm 2 may be increased, and of course, the rigidity of the vibration diaphragm 2 may also be enhanced by selecting a suitable material of the vibration diaphragm 2. For example, the vibration diaphragm 2 may be designed to have the mechanical sensitivity of 0.02 to 0.9 nm/Pa. That is to say, each time a pressure of 1 Pa is applied, the vibration diaphragm 2 will have a deflection of 0.02-0.9 nm. The vibration diaphragm 2 is 10-100 times as rigid as a conventional vibration diaphragm, so that the vibration diaphragm 2 is rigid enough to resist the atmospheric pressure in an ambient environment.

An initial gap between the vibration diaphragm 2 and the first substrate 1 may be designed in a range of 1-100 μm. The above-mentioned rigid vibration diaphragm 2 will not collapse under the atmospheric pressure.

In order to improve the sensitivity of the MEMS microphone, the MEMS microphone may adopt a highly-sensitive detection member, for example a high voltage capacitance detection structure.

In a specific embodiment of the present disclosure, the capacitance detection structure comprises a lower electrode 5 provided on the first substrate 1, and the lower electrode 5 and the vibration diaphragm form a capacitor structure capable of outputting a varying electrical signal.

In another specific embodiment of the present disclosure, the vibration diaphragm 2 may adopt an insulating material, and an upper electrode 6 is provided on the vibration diaphragm 2. The lower electrode 5 and the upper electrode 6 on the vibration diaphragm 2 form the capacitor structure capable of outputting a varying electrical signal. The upper electrode 6 and the lower electrode 5 may be formed by MEMS depositing and etching processes well known to those skilled in the art, which will not be specifically explained herein.

The lower electrode 5 may be provided on a side of the first substrate 1 that is adjacent to the vacuum chamber 4. Optionally, a passivation layer is provided to cover the lower electrode 5. The upper electrode 6 may be provided on a side of the vibration diaphragm 2 that is adjacent to or away from the vacuum chamber 4.

Alternatively, the vibration diaphragm 2 may adopt a composite structure. For example, in order to form the vacuum chamber, a covering layer having sacrificial holes is firstly provided on a sacrificial layer, and the sacrificial layer below the covering layer is etched off through the sacrificial holes. A filling layer is then deposited above the covering layer to seal the sacrificial holes in the covering layer to form the vacuum chamber. The upper electrode 6 may be provided in the composite structure of the vibration diaphragm 2 and will not be specifically explained herein.

An interval between the upper electrode 6 and the lower electrode 5 changes when the vibration diaphragm 2 vibrates, so that the capacitor structure can output the varying electrical signal. The working principle of such capacitors belongs to common general knowledge of those skilled in the art.

According to the MEMS microphone of the present disclosure, since the vibration diaphragm 2 and the first substrate 1 enclose the vacuum chamber 4, a high electric field can be formed in the vacuum chamber 4 without breakdown, and in particular the vibration diaphragm 2 having a high rigidity is used. In the present disclosure, the electric field between the upper electrode 6 and the lower electrode 5 is 100-300V/μm, that is, several hundred volts exist in a vacuum gap of several micrometers, and is 10 to 100 times as much as the electric field of a conventional microphone. Therefore, the sensitivity of the MEMS microphone according to the present disclosure can be greatly improved. The high electric field may be applied by an external bias voltage or by an electret formed on the vibration diaphragm 2 or the corresponding first substrate 1, which will not be specifically explained herein.

According to the MEMS microphone of the disclosure, the vacuum chamber is enclosed between the vibration diaphragm 2 and the first substrate 1, and the vacuum chamber has an air viscosity much lower than that of an ambient pressure, thereby reducing the influence of acoustic resistance on the vibration of the vibration diaphragm, and improving the signal-to-noise ratio of the microphone. In addition, since the MEMS microphone of such structure does not require a back cavity of a relatively large volume, the overall size of the MEMS microphone can be greatly reduced, and the reliability of the microphone is enhanced.

Figure 4:
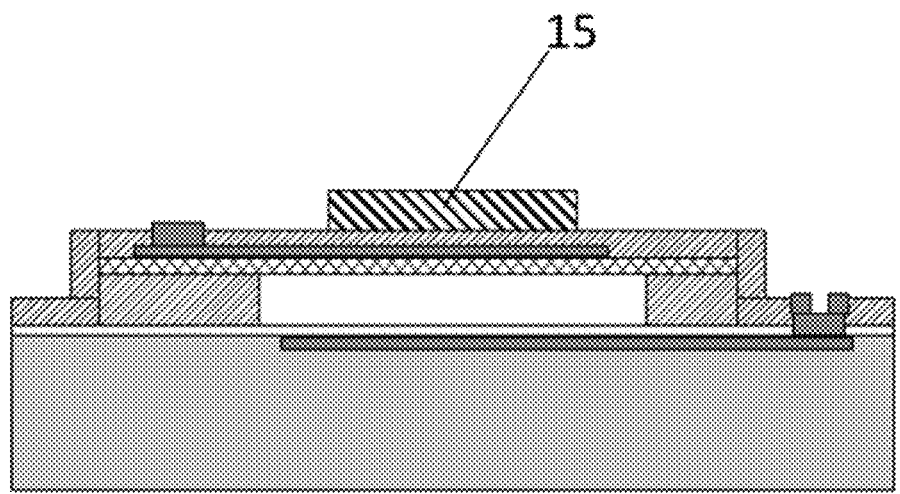
FIG. 4 is a schematic structural view of a third embodiment of the microphone of the present disclosure.

In an optional embodiment of the present disclosure, a reinforcing portion 15 is provided in a central region of a side of the vibration diaphragm 2 away from the vacuum chamber, with reference to FIG. 4. The reinforcing portion 15 is configured to reinforce the rigidity of the central region of the vibration diaphragm 2, can be regarded as a central thickening layer, and is made of a material same as or different from the vibration diaphragm 2.

Figure 5:
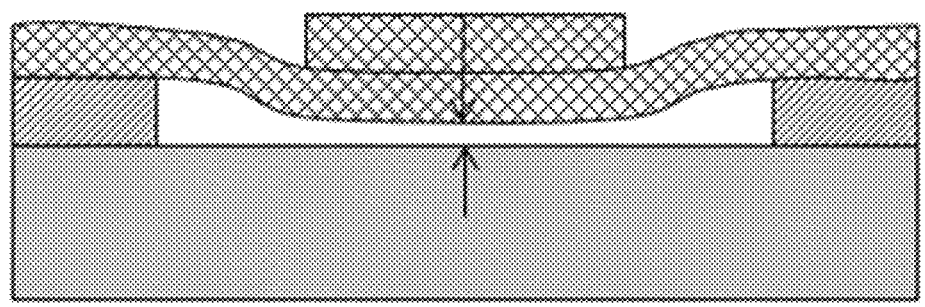
FIG. 5 is a schematic view of an action principle of the microphone of the embodiment in FIG. 4.

Referring to FIG. 5, when the vibration diaphragm 2 vibrates, the region of the vibration diaphragm 2 reinforced by the reinforcing portion 15 can be deflected towards the first substrate 1 synchronously by disposing the reinforcing portion 15 in the central region of the vibration diaphragm 2. The central region of the vibration diaphragm 2 performs a piston movement similar to an upper and lower translation, rather than a arc-shaped bending motion performed by the conventional vibration diaphragm, which increases the amount of variation detected by the capacitor.

Figure 2:
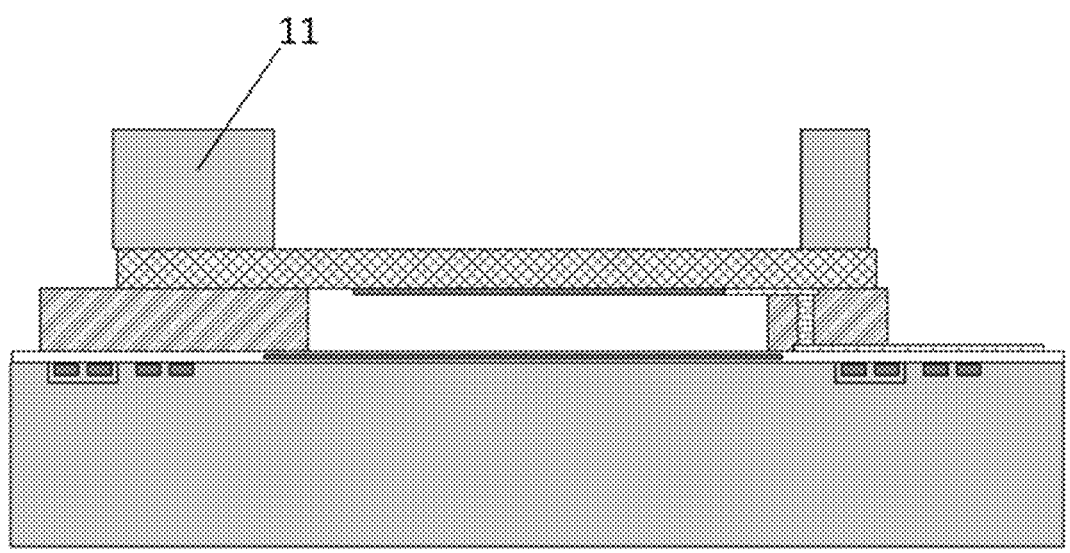
FIG. 2 is a schematic structural view of a second embodiment of the microphone of the present disclosure.

The MEMS microphone according to the present disclosure may also be manufactured by a bonding process in addition to the process of surface micromachining or bulk silicon micromachining. Referring to FIG. 2, a second substrate 11 is provided on a side of the vibration diaphragm 2 that is away from the vacuum chamber 4, and an opening exposing the vibration diaphragm 2 is provided on the second substrate 11 at a position corresponding to the central region of the vibration diaphragm.

During the manufacturing, a part of the spacing portion and the lower electrode are formed on the first substrate 1 by for example surface micromachining or bulk silicon micromachining, and the vibration diaphragm 2, the upper electrode on the vibration diaphragm 2 and the other part of the spacing portion are formed on the second substrate 11. Then the two parts of the spacing portion are bonded together in a vacuum environment by a bonding process, and finally the second substrate is processed. The second substrate may be completely removed, or a structure as shown in FIG. 2 may be formed. In the structure, the second substrate can protect the vibration diaphragm and the mounting flexibility of the microphone is also improved.

According to the microphone of the present disclosure, the upper electrode 6 on the vibration diaphragm 2 may be connected onto pins or in a circuit layout of the first substrate 1 by a lead. Since the spacing portion 3 exists between the vibration diaphragm 2 and the first substrate 1, for an electric connection, one end of the lead is electrically connected to the upper electrode 6, and the other end of the lead extends on the vibration diaphragm 2 to a position of the spacing portion 3 and passes through the spacing portion 3 to be connected into the circuit layout of the first substrate 1.

Specifically, referring to FIG. 1, the lead comprises a first conductive portion 7 extending on the vibration diaphragm 2, and a second conductive portion 8 extending in the spacing portion 3. One end of the first conductive portion 7 is electrically connected to the upper electrode 6, and the other end of the first conductive portion 7 extends on the vibration diaphragm 2 to the position of the spacing portion 3, and is electrically connected to the second conductive portion 8. The second conductive portion 8 passes through the upper and lower ends of the spacing portion 3, thereby introducing the signal of the upper electrode 6 into the circuit layout of the first substrate 1.

Since the lower electrode 5 is provided on the first substrate 1, the lower electrode 5 can be directly electrically connected to the circuit layout of the first substrate 1 by a lead, which will not be specifically explained herein.

In an optional embodiment of the present disclosure, referring to FIG. 1, an ASIC circuit 9 of the microphone may be integrated on the first substrate 1, and the output end of the capacitor may be electrically connected to the ASIC circuit 9 by the circuit layout on the first substrate 1 or in the first substrate 1, so that the electrical signal output by the capacitor can be processed by the ASIC circuit 9.

Figure 3:
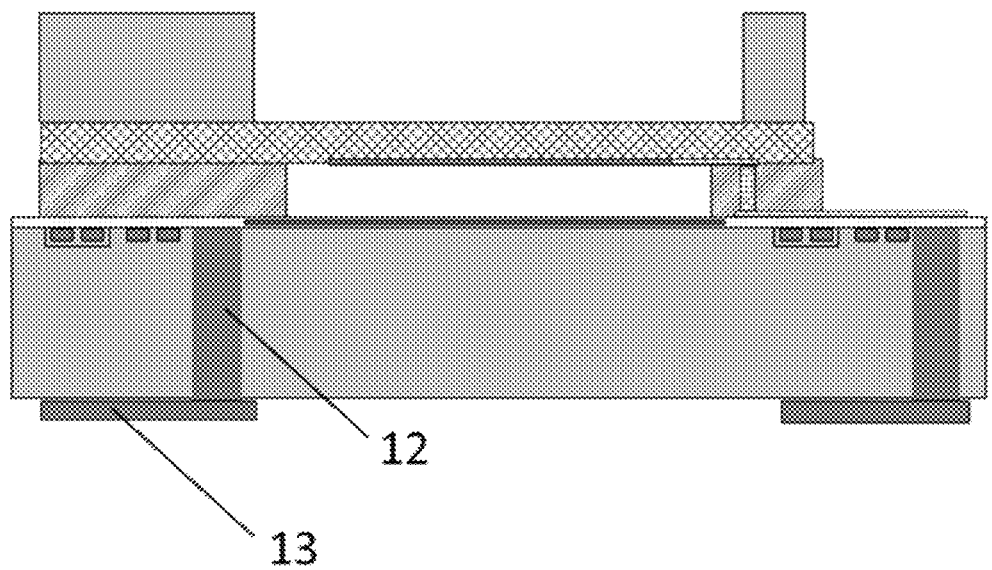
FIG. 3 is a schematic view of one of packaging manners for the microphone of the present disclosure.

The MEMS microphone according to the present disclosure does not require the back cavity of a relatively large volume, so that a wafer level package (WLP) can be completely adopted, and the microphone can be directly mounted on an external terminal without a conventional PCB package. In a specific embodiment of the present disclosure, referring to FIG. 3, a bonding pad 13 is formed at one end of the first substrate 1 away from the vacuum chamber 4, and the electrical signal located above the first substrate 1 may be introduced onto the bonding pad 13 by a metallized through hole 12, so that the MEMS microphone can be mounted directly by the bonding pad 13.

In another specific embodiment of the present disclosure, the externally connected pins may be formed on an upper surface of the first substrate (that is adjacent to the vibration diaphragm), and the microphone can be directly mounted on the external terminal by projection welding (solder ball mounting).

In another specific embodiment of the present disclosure, an edge of the vibration diaphragm 2 and the first substrate may be packaged by a plastic body, and only a region where the vibration diaphragm 2 is suspended is exposed.

Of course, the MEMS microphone according to the present disclosure may also adopt the conventional package structure, for example, a package structure defined by a circuit board and a shell is provided. The MEMS microphone is mounted in the package structure to form a conventional top or bottom package structure, and is finally mounted on the external terminal in the form of a microphone module.

The present disclosure has been explained in detail by the preferred embodiments. However, variations and additions on the various embodiments are obvious for those ordinary skilled in the art by reading the foregoing context. The applicant intends to include all such variations and additions within the scope of claims of the present disclosure.

Similar numbers refer to similar elements in the text. For the sake of clarity, some of the lines, layers, elements, components or features may be enlarged in the drawings.

The terms used herein are merely for the purpose of illustrating specific embodiments rather than limiting the present disclosure. Unless otherwise defined, all terms (including technical terms and scientific terms) used herein are the same as those understood by the ordinary skilled in the art of the present disclosure.

The invention claimed is:

1. An MEMS capacitor microphone, comprising a first substrate and a vibration diaphragm supported above the first substrate by a spacing portion, the first substrate, the spacing portion, and the vibration diaphragm enclosing a vacuum chamber, wherein a static deflection distance of the vibration diaphragm under an atmospheric pressure is less than a distance between the vibration diaphragm and the first substrate, wherein:
a lower electrode forming a capacitor structure with the vibration diaphragm is provided on a side of the first substrate that is adjacent to the vacuum chamber, and is adapted for maintaining an electric field between the vibration diaphragm and the lower electrode of 100-300 V/$\mu$m.

2. The MEMS capacitor microphone according to claim 1, wherein the vibration diaphragm comprises an insulating material, and an upper electrode forming a capacitor structure with the lower electrode is provided on the vibration diaphragm.

3. The MEMS capacitor microphone according to claim 1, wherein the vibration diaphragm comprises a composite structure, and the upper electrode is provided in the composite structure of the vibration diaphragm.

4. The MEMS capacitor microphone according to claim 1, wherein the upper electrode on the vibration diaphragm is electrically connected to a circuit layout on the first substrate by a lead.

5. The MEMS capacitor microphone according to claim 1, wherein the vibration diaphragm has a mechanical sensitivity of 0.02 to 0.9 nm/Pa.

6. The MEMS capacitor microphone according to claim 1, wherein an initial gap between the vibration diaphragm and the first substrate is 1-100 μm.

7. The MEMS capacitor microphone according to claim 1, further comprising an ASIC circuit integrated on the first substrate.

8. The MEMS capacitor microphone according to claim 1, wherein a reinforcing portion is provided at a central region of the vibration diaphragm that is away from the vacuum chamber.

9. The MEMS capacitor microphone according to claim 1, wherein a second substrate is further provided on a side of the vibration diaphragm that is away from the vacuum chamber, and an opening exposing the vibration diaphragm is formed on the second substrate at a position corresponding to a central region of the vibration diaphragm.

10. The MEMS capacitor microphone according to claim 1, wherein a bonding pad for an external connection is provided on a side of the first substrate that is away from the vacuum chamber.

* * * * *